(12) United States Patent
Pindl et al.

(10) Patent No.: US 9,018,661 B2
(45) Date of Patent: Apr. 28, 2015

(54) OPTOELECTRONIC COMPONENT AND METHOD FOR PRODUCING AN OPTOELECTRONIC COMPONENT

(75) Inventors: Markus Pindl, Tegernheim (DE); Simon Jerebic, Tegernheim (DE); Tobias Gebuhr, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/983,853

(22) PCT Filed: Jan. 19, 2012

(86) PCT No.: PCT/EP2012/050776
§ 371 (c)(1),
(2), (4) Date: Oct. 3, 2013

(87) PCT Pub. No.: WO2012/107263
PCT Pub. Date: Aug. 16, 2012

(65) Prior Publication Data
US 2014/0014995 A1    Jan. 16, 2014

(30) Foreign Application Priority Data
Feb. 11, 2011 (DE) .......................... 10 2011 003 969

(51) Int. Cl.
| | |
|---|---|
| *H01L 33/00* | (2010.01) |
| *H01L 33/56* | (2010.01) |
| *H01L 33/48* | (2010.01) |
| *H01L 33/50* | (2010.01) |
| *H01L 33/54* | (2010.01) |
| *H01L 33/58* | (2010.01) |

(52) U.S. Cl.
CPC .............. *H01L 33/56* (2013.01); *H01L 33/483* (2013.01); *H01L 33/505* (2013.01); *H01L 33/54* (2013.01); *H01L 33/58* (2013.01); *H01L 2933/005* (2013.01); *H01L 2224/48091* (2013.01); *H01L 2224/48464* (2013.01); *H01L 2224/73265* (2013.01); *H01L 2924/0002* (2013.01)

(58) Field of Classification Search
CPC ......... H01L 27/15; H01L 33/00; H01L 51/50; H01L 51/525; H01L 51/5253
USPC ..................................... 257/80–100
See application file for complete search history.

(56) References Cited

U.S. PATENT DOCUMENTS

| | | | |
|---|---|---|---|
| 3,816,847 A | 6/1974 | Nagao | |
| 6,798,133 B1 * | 9/2004 | Ambrugger et al. | 313/498 |

(Continued)

FOREIGN PATENT DOCUMENTS

| | | |
|---|---|---|
| DE | 196 25 622 A1 | 1/1998 |
| DE | 10 2007 018 837 A1 | 10/2008 |

(Continued)

*Primary Examiner* — Brook Kebede
(74) *Attorney, Agent, or Firm* — DLA Piper LLP (US)

(57) ABSTRACT

An optoelectronic component includes a substrate, a semiconductor chip arranged on the substrate, and a light-transmissive cover, wherein the light-transmissive cover covers at least an area of the semiconductor chip facing away from the substrate, the light-transmissive cover has a hardness greater than that of silicone, and a connecting material is arranged as a potting material between the light-transmissive cover and the substrate such that those areas of the semiconductor chip not covered by the substrate are surrounded by the connecting material, and the connecting material forms a cavity seal.

18 Claims, 21 Drawing Sheets

(56) References Cited

U.S. PATENT DOCUMENTS

| | | |
|---|---|---|
| 2003/0098651 A1 | 5/2003 | Lin et al. |
| 2005/0239227 A1 | 10/2005 | Aanegola et al. |
| 2008/0023711 A1 | 1/2008 | Tarsa et al. |
| 2008/0117500 A1* | 5/2008 | Narendran et al. ............ 359/326 |
| 2008/0258164 A1* | 10/2008 | Masui et al. ..................... 257/98 |
| 2009/0278147 A1* | 11/2009 | Suzuki ............................ 257/98 |
| 2010/0181582 A1 | 7/2010 | Li et al. |
| 2011/0095318 A1* | 4/2011 | Liao ................................ 257/98 |

FOREIGN PATENT DOCUMENTS

| | | |
|---|---|---|
| DE | 10 2007 043 183 A1 | 4/2009 |
| DE | 10 2007 046 348 A1 | 4/2009 |
| DE | 10 2007 046 496 A1 | 4/2009 |
| DE | 10 2007 059 548 A1 | 4/2009 |
| DE | 10 2008 011 153 A1 | 5/2009 |
| DE | 10 2008 016 457 A1 | 10/2009 |
| DE | 10 2008 021 436 A1 | 5/2010 |
| EP | 2030752 A1 * | 3/2009 |
| EP | 2197048 A1 * | 6/2010 |
| JP | 2008-060166 A | 3/2008 |
| JP | 2010-040986 A | 2/2010 |
| WO | 2005/081319 A1 | 9/2005 |
| WO | 2010/017831 A1 | 2/2010 |

* cited by examiner

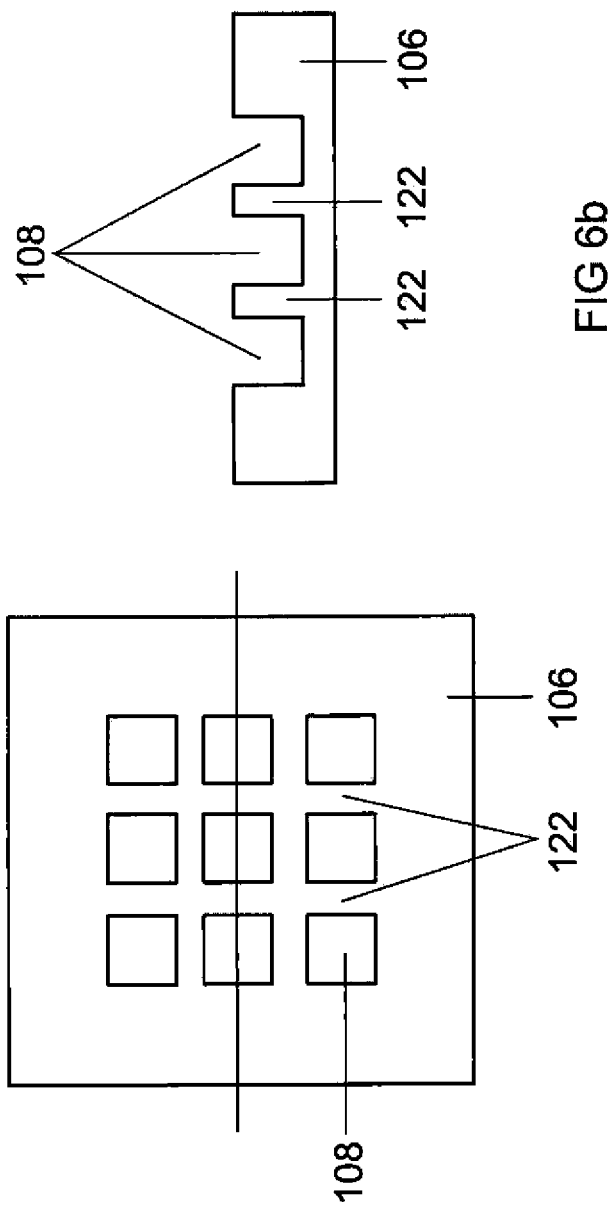

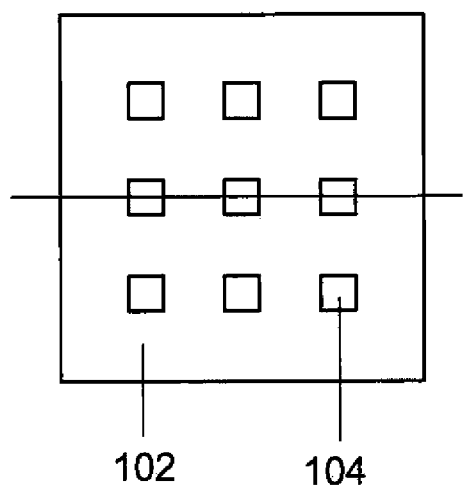
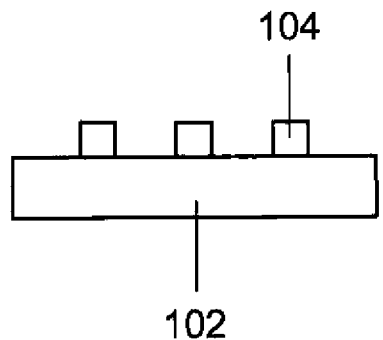
FIG 9a　　　　　　　　FIG 9b
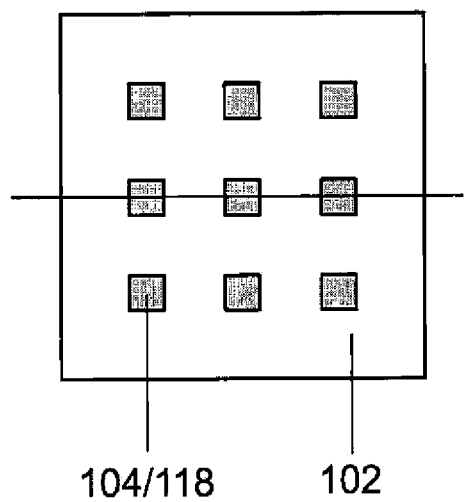
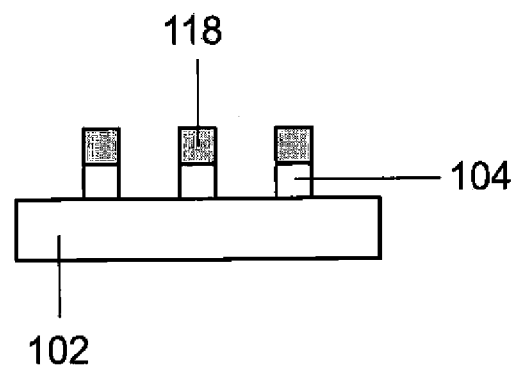
FIG 10a　　　　　　　FIG 10b

OPTOELECTRONIC COMPONENT AND METHOD FOR PRODUCING AN OPTOELECTRONIC COMPONENT

TECHNICAL FIELD

This disclosure relates to an optoelectronic component, and to a method of producing such a component.

BACKGROUND

Optoelectronic components comprise a semiconductor chip which can emit electromagnetic radiation. The semiconductor chip can be potted with a potting material to protect the semiconductor chip against harmful environmental influences such as water or oxygen, for example. The potting material can comprise silicone. Silicone is generally soft. This is disadvantageous in the further processing of the optoelectronic components. This is because a vacuum pipette in an automatic placement machine can grip a component having a soft silicone surface only poorly.

It could therefore be helpful to provide an optoelectronic component and a method of producing such a component in which the optoelectronic component is protected toward the outside by a hard light-transmissive cover.

SUMMARY

We provide an optoelectronic component including a substrate, a semiconductor chip arranged on the substrate, and a light-transmissive cover, wherein the light-transmissive cover covers at least an area of the semiconductor chip facing away from the substrate, the light-transmissive cover has a hardness greater than that of silicone, and a connecting material is arranged as a potting material between the light-transmissive cover and the substrate such that those areas of the semiconductor chip not covered by the substrate are surrounded by the connecting material, and the connecting material forms a cavity seal.

We also provide a method of producing an optoelectronic component including providing a light-transmissive cover, applying connecting material to the light-transmissive cover, providing a substrate on which a plurality of semiconductor chip are arranged, connecting the substrate with the plurality of semiconductor chips to the light-transmissive cover, wherein the semiconductor chips face in a direction of the light-transmissive cover, and curing the connecting material.

We further provide an optoelectronic component including a substrate, a semiconductor chip arranged on the substrate, and a light-transmissive cover, wherein the light-transmissive cover covers at least an area of the semiconductor chip facing away from the substrate, and the light-transmissive cover has a hardness greater than that of silicone.

BRIEF DESCRIPTION OF THE DRAWINGS

Various examples are explained in greater detail below with reference to the drawings. Elements that are identical, of identical type or act identically are provided with the same reference signs in the figures. The figures and the size relationships of the elements illustrated in the figures among one another should not be regarded as to scale. Rather, individual elements may be illustrated with an exaggerated size or a reduced size to enable better illustration and/or to afford a better understanding.

FIGS. 4a, 5a, 6a show examples of light-transmissive covers in plan view.

FIGS. 4b, 5b, 5c, 6b show examples of light-transmissive covers in sectional view.

FIGS. 9a, 10a show examples of a substrate with a plurality of semiconductor chips in plan view.

FIGS. 9b, 10b show examples of a substrate with a plurality of semiconductor chips in sectional view.

LIST OF REFERENCE SIGNS

Figure 1A:
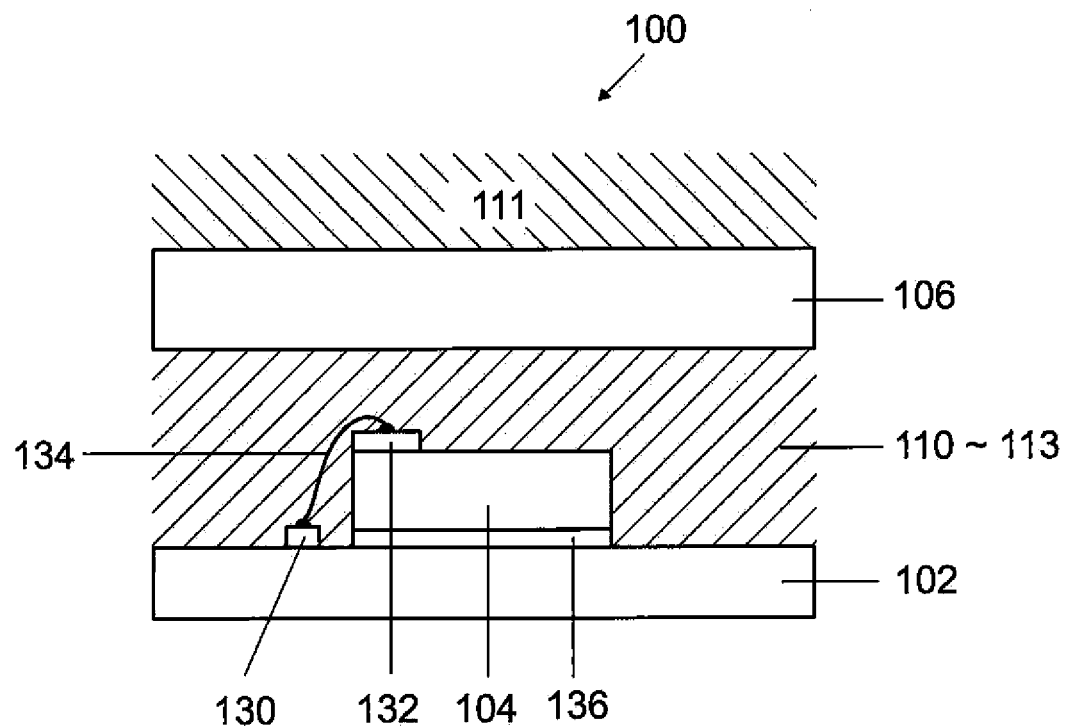
FIGS. 1a, 1b show examples of an optoelectronic component including a light-transmissive cover in the form of a planar plate in sectional view.

100 Optoelectronic component
102 Substrate
104 Semiconductor chip
106 Light-transmissive cover
108 Cavity
110 Connecting material
111 Ambient air
112 Cavity seal/adhesive
113 Potting material
114 Antireflection layer
115 Gas in the cavity
116 Imaging element, in particular lens
118 Conversion layer
120 Potting seal
122 Webs
124 Phosphor particles
130 Bonding pad (on substrate)
132 Contact pad (on semiconductor chip)
134 Bonding wire
136 Semiconductor chip contact layer
138 Flip-chip contacts
140 Flip-chip contact layers
142 Flip-chip contact material

DETAILED DESCRIPTION

Various examples of our components comprise an optoelectronic component comprising a semiconductor chip arranged on a substrate. A light-transmissive cover covers at least that area of the semiconductor chip which faces away from the substrate. The light-transmissive cover has a hardness greater than that of silicone.

This is particularly advantageous since the hard light-transmissive cover ensures that the optoelectronic component is largely protected against harmful gases or water, the vacuum pipette in the automatic placement machine can grip the component well and the component is not damaged during further processing. Using a relatively softer silicone potting instead of the light-transmissive hard cover is disadvantageous for the following reason. Silicone has a yield point much higher than that of a bonding wire composed of gold, which is generally used to make contact with a semiconductor chip in an optoelectronic component. Without the protection and stabilization of the hard light-transmissive cover, the bonding wire can tear during placement without the silicone being damaged. The component is defective without this becoming apparent during optical inspection.

Hardness is the mechanical resistance with which a material opposes the mechanical penetration of a harder test penetrator. The less deeply the test penetrator penetrates into the material, the harder the material. The above condition that the light-transmissive cover is harder than silicone accordingly means that the light-transmissive cover offers a greater mechanical resistance to the test penetrator than silicone.

The hardness of elastomers such as silicone is rated according to a different scale than the hardness of mineral substances such as glass. The hardness is measured in terms of "Shore" in the case of elastomers and the hardness is measured in terms of "Mohs" in the case of mineral substances.

Silicone can conceptually be separated into soft and hard silicone. Soft silicone has a degree of hardness of approximately Shore 20 to approximately Shore 60, preferably approximately Shore 40 to approximately Shore 50. Hard silicone can have a Shore value of more than 60. The Shore hardness is a material characteristic value for elastomers and plastics. These substances are elastic, that is to say that they are not permanently deformed. The scale extends from 0 Shore to 100 Shore. 0 Shore means minimum hardness and 100 Shore means maximum hardness.

The light-transmissive cover is preferably of mineral origin, that is to say composed of a largely inelastic solid. By way of example, glass is used. In mineralogy, the hardness test according to Mohs is used. The hardness for glass is 6 to 7, depending on the type of glass. The greater the Mohs value, the greater the hardness of the substance. Talc has the Mohs value 1, and diamond the Mohs value 10.

Since hardness indications in terms of Mohs and Shore cannot be directly compared exactly to one another, for the comparison of the hardness of solid substances it is possible to have recourse to the comparison of the moduli of elasticity of these solid substances. The greater the modulus of elasticity of a substance, the greater in general the hardness of the substance. The modulus of elasticity describes the relationship between stress and elongation in the deformation of a solid body. The absolute value of the modulus of elasticity is greater, the more resistance a material offers to its deformation. A component composed of a material having a high modulus of elasticity, e.g., glass, is therefore stiff, and a component composed of a material having a low modulus of elasticity, e.g., silicone, is compliant. The unit of the modulus of elasticity is newtons per square millimeter, $N/mm^2$. The modulus of elasticity of silicone is $10 N/mm^2$ to $100 N/mm^2$, depending on the type of silicone. The modulus of elasticity of glass is $50 000 N/mm^2$ to $90 000 N/mm^2$, depending on the type of glass.

A printed circuit board, a metal-core circuit board or a ceramic can serve as substrate.

Preferably, the semiconductor chip is based on a III-V compound semiconductor material, in particular on gallium nitride (GaN). The semiconductor chip has at least one active zone which emits electromagnetic radiation. The active zones can be pn junctions, a double heterostructure, multiple quantum well structure (MQW), single quantum well structure (SQW). Quantum well structure means: quantum wells (3-dim), quantum wires (2-dim) and quantum dots (1-dim).

Preferably, the semiconductor chip can be a surface emitter, in particular a so-called "thin-film" chip. The thin-film chip is known from WO2005081319A1, for example.

Preferably, a cavity is formed in the light-transmissive cover. The semiconductor chip extends at least partly into the cavity. This is particularly advantageous since, as a result, the semiconductor chip is at least partly protected including at the side areas perpendicular to the substrate.

Preferably, the cavity is filled with a gas, in particular an inert gas. The risk of a harmful delamination between a potting material in the cavity and the semiconductor chip is omitted.

Preferably, the cavity is fixed with a connecting material as an adhesive in the form of a cavity seal on the substrate. This is particularly advantageous since the adhesive fixedly connects the cavity to the substrate and tightly seals it. Silicone, epoxy or hybrids is/are suitable as connecting material. Silicone-epoxy or silicone-polyester can be used as hybrids.

Preferably, between the light-transmissive cover and the substrate, a connecting material is arranged as a potting material such that those areas of the semiconductor chip not covered by the substrate are surrounded by the connecting material. If the light-transmissive cover forms a cavity, then the mechanical stability of the optoelectronic component is additionally increased since the side walls of the cavity support the cavity on the substrate. Furthermore, that region of the exposed connecting material is minimized by the cavity. The optoelectronic component is less susceptible to the penetration of water or harmful gases into the connecting material.

The connecting material preferably comprises silicone. Silicone is transparent and radiation-stable. The connecting material particularly preferably comprises soft silicone. Soft silicone has a high thermal stability, a high radiation stability and a high elongation at break, as a result of which the risk of cracking in the silicone is minimized.

Although a potting material composed of hard silicone (Shore value greater than 60) without a light-transmissive hard cover would also facilitate the processability of the optoelectronic component, hard silicone tends toward cracking, which can destroy the optoelectronic component.

An optoelectronic component comprising a hard light-transmissive cover is also advantageous with respect to the following designs. Silicone from the potting material of the semiconductor chip can be glazed at its surface. Although a non-tacky surface arises as a result, the glazed layer is only a few nanometers thick and can therefore easily break. Alternatively, the semiconductor chip can be potted in the form of a lower potting material. A meniscus arises with the advantage that hardly any tacky silicone is present at the surface. However, particles, in particular dust particles, still adhere to the silicone surface.

As already described above, in one preferred example, the light-transmissive cover can be realized by a glass cover. This is advantageous for a number of reasons.

The glass cover is hard.

The glass cover is virtually transparent to electromagnetic radiation in the visible spectral range. Given a glass thickness of 100 μm, only a proportion of approximately 0.5% of the light emitted by the semiconductor chip is absorbed in the glass. Since glass is radiation-stable, the high transmissivity is maintained even during long operation of the optoelectronic component.

Glass is impermeable to gases. Therefore, in particular no harmful oxygen can penetrate into the cavity via the area covered by the glass. Glass is chemically inert. Glass is also corrosion- and ageing-stable.

Glass has a low coefficient of thermal expansion which is preferably of the order of magnitude of the substrate, in particular of the ceramic substrate. In the case of instrumentation glass, the coefficient of thermal expansion is $4.5 \times 10^{-6}$ $K^{-1}$. Ceramic can have a medium coefficient of expansion of approximately $6 \times 10^{-6} K^{-1}$. The similarity between the coefficients of thermal expansion of the light-transmissive cover and of the substrate is advantageous since no curvature of the optoelectronic component arises in the event of a temperature change. Curved areas would no longer be processable. In particular, gripping the optoelectronic component by a vacuum pipette would no longer function.

Glass adheres well to the connecting material silicone. This is particularly advantageous since the unit comprising cavity, semiconductor chip and substrate is configured particularly stably as a result.

Glass is non-tacky. This is advantageous since no impurities adhere to the glass and neighboring optoelectronic components do not stay stuck together.

Glass can be a planar structure in a simple manner. This is advantageous for placement with optoelectronic components.

Preferably, the light-transmissive cover has an antireflection layer. The antireflection layer consists of a combination of layers composed of $SiO_2$ and $Al_2O_3$. The layers can be vapor-deposited onto the light-transmissive cover by CVD or PVD. The antireflection layer can be fitted on one side of the light-transmissive cover or on both sides of the light-transmissive cover. Antireflection layers are particularly advantageous since they reduce the proportion of electromagnetic radiation reflected back into the optoelectronic component.

Preferably, the light-transmissive cover can have a thickness of approximately 30 μm to approximately 100 μm. This is advantageous since the dimension of the optoelectronic component is thereby increased only slightly. Moreover, the thickness of the plate is sufficient to ensure the necessary stability and impermeability toward oxygen.

Preferably, an imaging element, in particular a lens, can be arranged on that area of the light-transmissive cover facing away from the substrate. This is particularly advantageous since the light emitted from the semiconductor chip can be collected via the lens. The lens can be integral and monolithic with the light-transmissive cover.

Preferably, a conversion layer can be applied directly to that area of the semiconductor chip facing away from the substrate. The conversion layer can be a converter-filled silicone lamina. The phosphor can be embedded into the silicone lamina. Alternatively, the lamina can be a sintered ceramic lamina in which the phosphor is embedded in the ceramic lamina. The phosphor particles comprise phosphorescent materials. The phosphorescent materials can comprise yttrium aluminum garnet or orthosilicates. The so-called layer transfer is described by way of example in WO2010017831. This so-called "near-chip" conversion is advantageous since the electromagnetic radiation is converted in a focal plane with the chip.

Preferably, the surface of the light-transmissive cover, in particular composed of glass, can be roughened. roughening reduces the proportion of radiation totally reflected at the interface between glass (refractive index: 1.5) and air (refractive index: 1). The consequence of roughening is an increased coupling-out efficiency. As an alternative to roughening, a pyramid structure can be arranged on the surface of the light-transmissive cover.

We also provide methods of producing a plurality of optoelectronic components. First, a light-transmissive cover is provided. Afterward, connecting material is applied to the light-transmissive cover. Afterward, a substrate is provided, on which a plurality of semiconductor chips are arranged. Afterward, the substrate with the plurality of semiconductor chips is connected to the light-transmissive cover. In this case, the semiconductor chips face in the direction of the light-transmissive cover. Afterward, the connecting material is cured. This method is advantageous since a plurality of optoelectronic components can be produced simultaneously by the above process steps.

Preferably, the light-transmissive cover has a circumferential potting seal at its outer edge. This is advantageous since the potting seal prevents the connecting material from escaping via the edge of the light-transmissive cover. Moreover, the circumferential potting seal serves as a spacer for the light-transmissive cover. The spacer is particularly advantageous in the case of a light-transmissive cover without cavities. This ensures that the distance between substrate and light-transmissive cover is homogeneous. Moreover, without cavities, the precise alignment of the substrate with the plurality of semiconductor chips is obviated.

Preferably, the light-transmissive cover has a plurality of cavities with webs situated there between. This is advantageous since the webs are placed onto the substrate and a defined distance between light-transmissive cover and substrate is thereby achieved. Moreover, during the optional concluding method step of singulating the components, the cavities are advantageous since the hard light-transmissive cover is easier to saw than the combination of soft connecting material and hard cover.

Preferably, applying connecting material to the light-transmissive cover comprises applying connecting material as adhesive to the webs between the cavities. This is advantageous for arrangements in which the semiconductor chips are intended to be enclosed in a gas-tight manner in the cavities, without connecting material penetrating into the cavities. Silicone can be used as adhesive.

Preferably, applying connecting material to the light-transmissive cover comprises filling the light-transmissive cover with connecting material as a potting material. This is advantageous since high stability of the arrangement comprising cover and substrate with the plurality of semiconductor chips is achieved.

Preferably, after connecting the substrate to the light-transmissive cover and before curing the connecting material filled with phosphor particles, the unit comprising substrate and light-transmissive cover is rotated by 180° about an axis lying in the plane formed between the light-transmissive cover and the substrate. This rotation is advantageous since, after rotating the unit and before curing the connecting material filled with phosphor particles, the phosphor particles can be sedimented onto the semiconductor chips. The phosphor particles are sedimented by the action of gravitational force and/or centrifugal force on the phosphor particles. It is important above all for the connecting material to have a very low viscosity before curing. What can be achieved as a result is that the phosphor particles in the connecting material sediment rapidly. The sedimentation of the phosphor particles is advantageous since this reduces the undesirable lateral emission of primary light, in particular of blue light, from the semiconductor chips.

Preferably, before providing the substrate with a plurality of semiconductor chips, a conversion layer is already applied directly to that area of the semiconductor chips which faces away from the substrate.

Preferably, after curing the connecting material, the optoelectronic components are singulated. This can be realized by separating by grinding, laser separation, water jet cutting or scribing and breaking.

Turning now to the Drawings, FIG. 1a shows an example of an optoelectronic component 100 comprising a light-transmissive cover 106 in the form of a planar plate in sectional view. A semiconductor chip 104 is arranged on a substrate 102. The light-transmissive cover 106 covers that area of the semiconductor chip 104 facing away from the substrate 102. A connecting material 110 as potting material 113 is arranged between substrate 102 and light-transmissive cover 106. The connecting material 110 connects the light-transmissive cover 106 to the substrate 102 and protects the potted semiconductor chip 104. The areas of the semiconductor chip 104 not covered by the substrate 102 are surrounded by the connecting material 110. The connecting material 110 comprises silicone. The light-transmissive cover 106 has a hardness greater than that of silicone. The light-transmissive cover 106 can be a glass cover. The light-transmissive cover 106 can have a thickness of approximately 30 µm to approximately 100 µm. The contact pad 132 of the semiconductor chip 104 is contact-connected to a bonding pad 130 on the substrate 102 via a bonding wire 134. Moreover, the semiconductor chip 104 electrically and mechanically connects to the substrate via the semiconductor chip contact layer 136. The semiconductor chip 104 is a surface emitter. The semiconductor chip 104 can be a GaN compound semiconductor. Ambient air 111 surrounds the optoelectronic component 100.

Figure 1B:
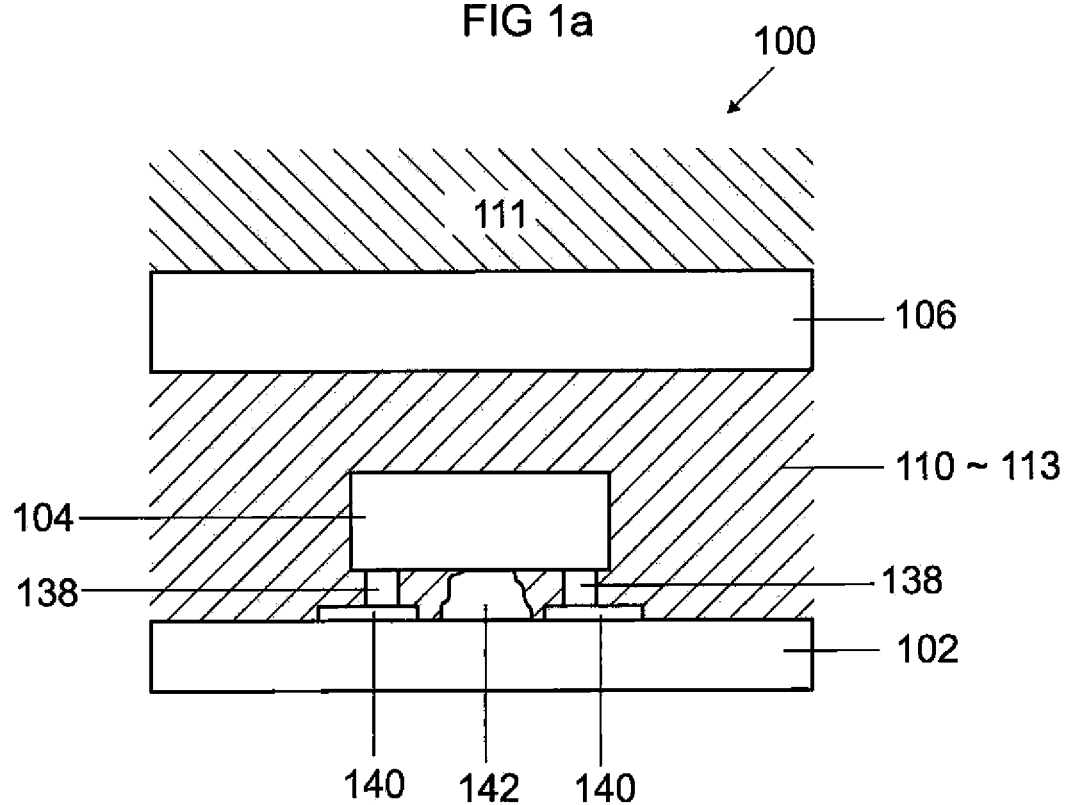

FIG. 1b shows a further example of an optoelectronic component 100 comprising a light-transmissive cover 106 in the form of a planar plate in sectional view. A flip-chip arrangement is shown. In the case of a flip-chip arrangement, the emission area of the semiconductor chip 104 is contact-free. The emission area is the interface which faces toward the light-transmissive cover 106. Both flip-chip contacts 138 of the semiconductor chip 104 are realized on that side of the semiconductor chip 104 which faces toward the substrate 102. Therefore, losses as a result of shading are avoided by the flip-chip technique. Flip-chip contact layers 140 are provided on the substrate 102 for electrical linking of the semiconductor chip 104. Mechanical linking of the semiconductor chip 104 to the substrate 102 is realized by flip-chip contact material 142.

For reasons of clarity, the electrical contacts and the bonding wire are omitted in all the subsequent figures.

Figure 1C:
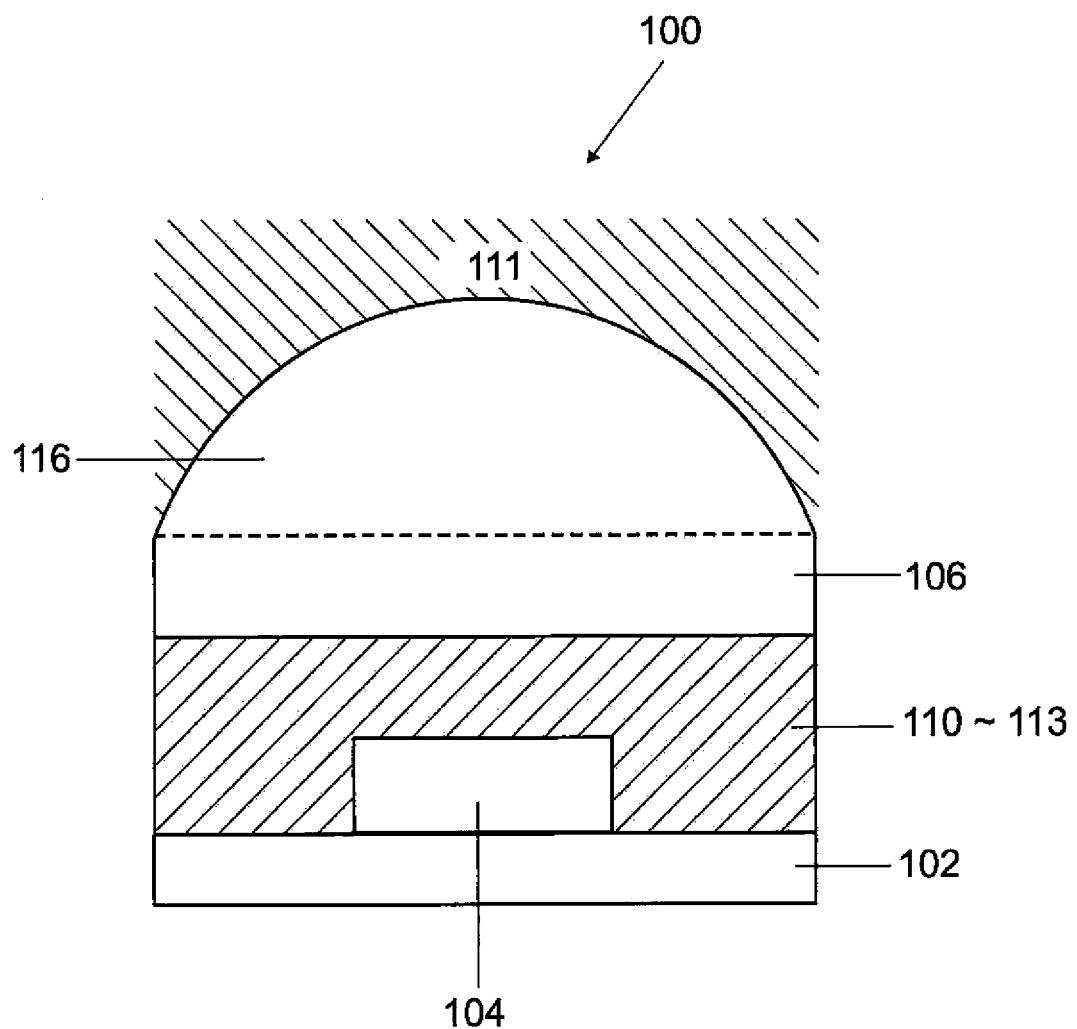
FIGS. 1c, 1d show examples of an optoelectronic component including a light-transmissive cover and a lens in sectional view.

FIG. 1c shows an example of an optoelectronic component 100 comprising a light-transmissive cover 106 and an imaging element 116 in sectional view. An imaging element 116, in particular a lens composed of glass, is arranged on the light-transmissive cover 106 composed of glass. The lens 116 is arranged on that area of the light-transmissive cover 106 facing away from the substrate 102. The lens 116 is planoconvex, that is to say curved outwardly. The lens 116 can be integral and monolithic with the light-transmissive cover 106. The semiconductor chip 104 is potted in connecting material 110. The refractive index of glass is approximately 1.5. The connecting material 110 can be silicone having a refractive index of between 1.4 and 1.6. Electromagnetic radiation emitted by the semiconductor chip 104 is hardly refracted and, therefore, also hardly changed in its direction owing to the similar refractive index of silicone and glass upon the transition from the connecting material 110 silicone to the light-transmissive cover 106 composed of glass. It is only upon transition of the electromagnetic radiation from the curved surface of the lens 116 to the ambient air 111 having a refractive index of 1 that refraction with a significant change of direction takes place. This effect on the beam path is very advantageous. Owing to the outwardly curved surface of the lens 116, the optoelectronic component 100 has to be gripped laterally during the placement process.

Figure 1D:
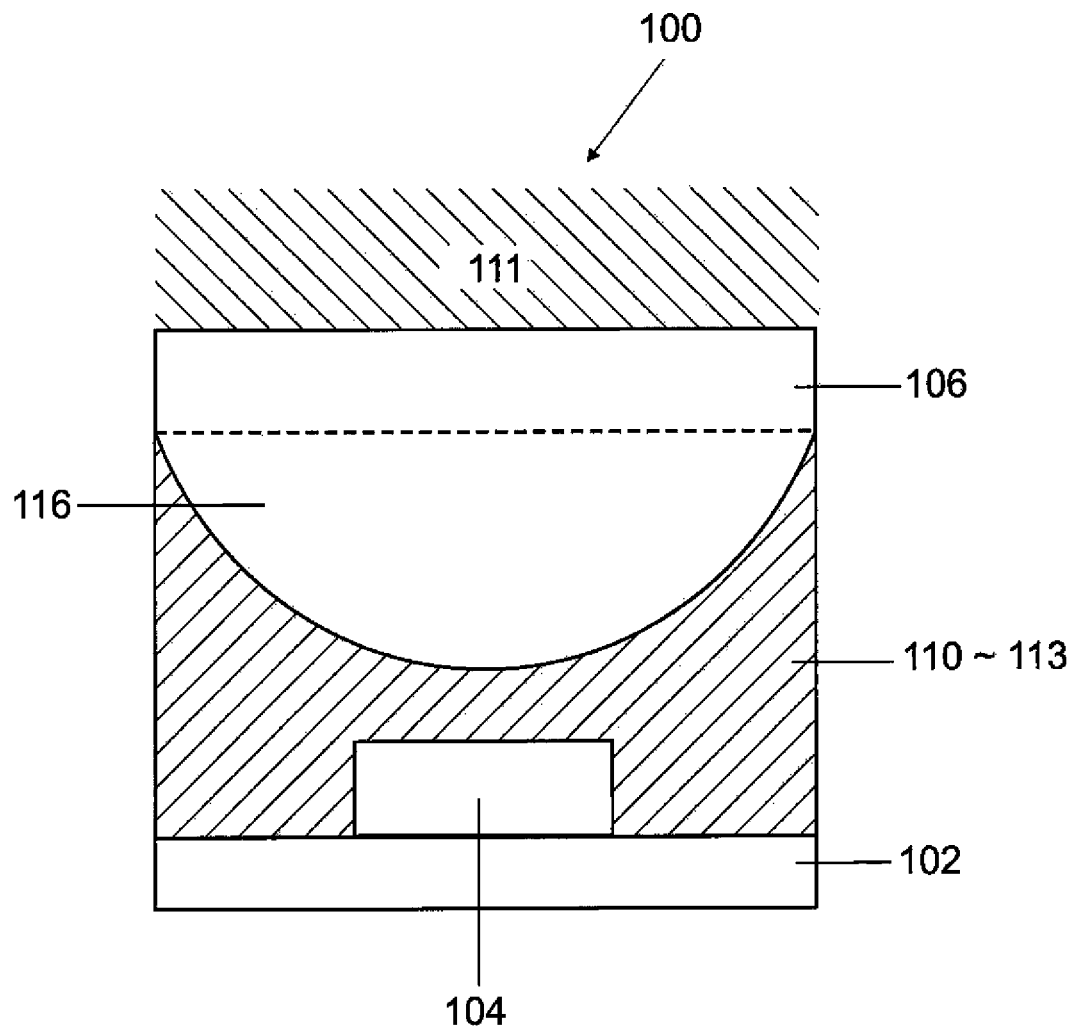

FIG. 1d shows a further example of an optoelectronic component 100 comprising a light-transmissive cover 106 and a lens 116 in sectional view. The lens 116 shown is planoconvex. The curved lens area adjoins the connecting material 110 composed of silicone. Owing to the similarity of the refractive indexes of silicone and glass, however, the refractive effect on the electromagnetic radiation upon the transition from the connecting material 110 to the glass lens 116 is minimal. The planar surface upon the transition from the light-transmissive cover 106 to the ambient air 111 is advantageous, however. The planar surface enables the optoelectronic component 100 to be gripped in a simple manner during placement.

Figure 2A:
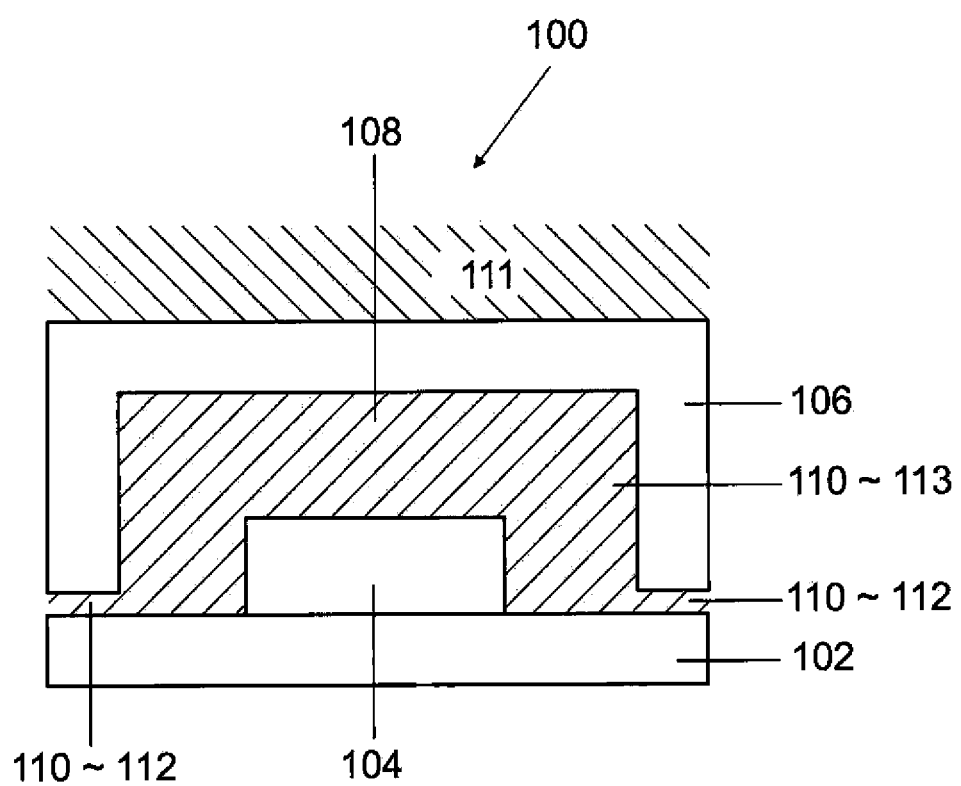
FIGS. 2a to 2j show examples of an optoelectronic component including a light-transmissive cover in the form of a cavity in sectional view.

FIG. 2a shows an example of an optoelectronic component 100 comprising a light-transmissive cover 106 in the form of a cavity 108 in sectional view. The semiconductor chip 104 extends at least partly into the cavity 108. The space between the light-transmissive cover 106 and the substrate 102 is potted with the connecting material 110 silicone. The light-transmissive cover 106 is seated on the substrate 102. A cavity seal 112 composed of clear silicone is arranged between the cover 106 and the substrate 102. The cavity seal 112 prevents harmful gases from penetrating into the cavity. The cavity seal 112 composed of clear silicone has a thickness of 3 µm to 10 µm. Owing to this small distance between light-transmissive cover 106 and substrate 102, coefficients of thermal expansion that are as similar as possible for both materials are important. Therefore, glass as cover 106 and ceramic as substrate 102 are particularly well suited.

Figure 2B:
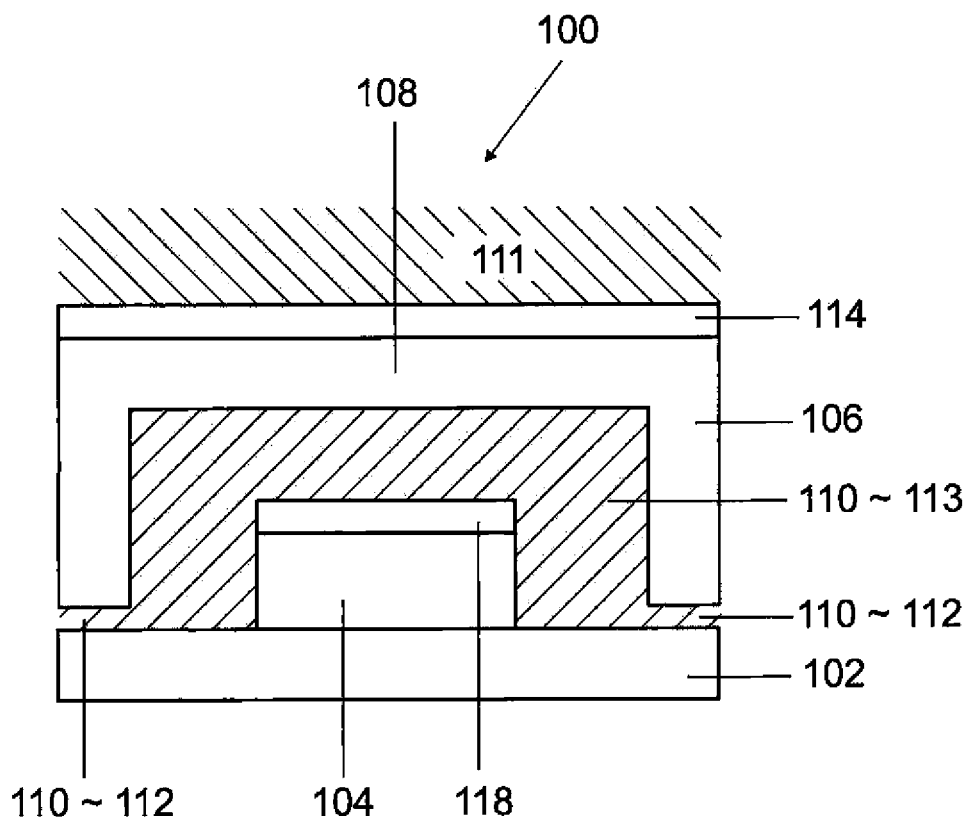

FIG. 2b shows a further example of an optoelectronic component 100 comprising a light-transmissive cover 106 in the form of a cavity 108 in sectional view. In addition to the example from FIG. 2a, a conversion layer 118 is applied directly to that area of the semiconductor chip 104 facing away from the substrate 102. The phosphor particles in the conversion layer 118 convert short-wave primary light into longer-wave secondary light. As already in FIG. 2a, the connecting material 110 is clear silicone. In addition to the example from FIG. 2a, an antireflection layer 114 is applied on the light-transmissive cover 106.

Figure 2C:
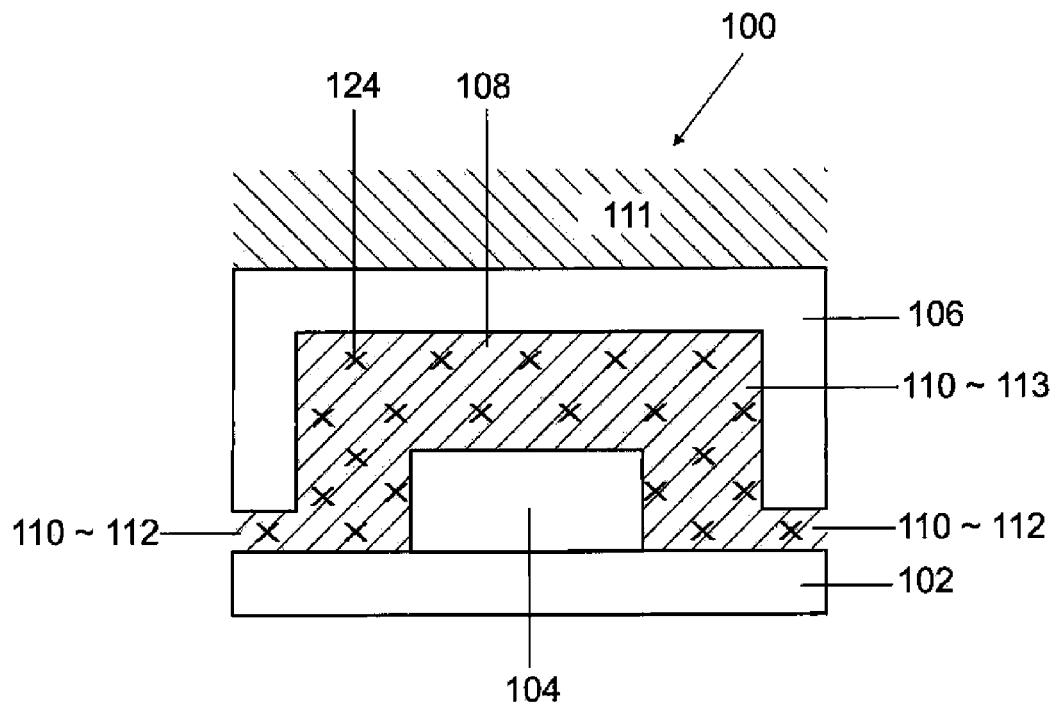

FIG. 2c shows a further example of an optoelectronic component 100 comprising a light-transmissive cover 106 in the form of a cavity 108 in sectional view. The connecting material 110 as potting 113 comprises silicone with phosphor particles 124 distributed approximately homogeneously therein. The thickness of the cavity seal 112 is 30 µm to 50 µm and limited by the size of the phosphor particles 124. For the rest, the example in FIG. 2c corresponds to the example in FIG. 2a.

Figure 2D:
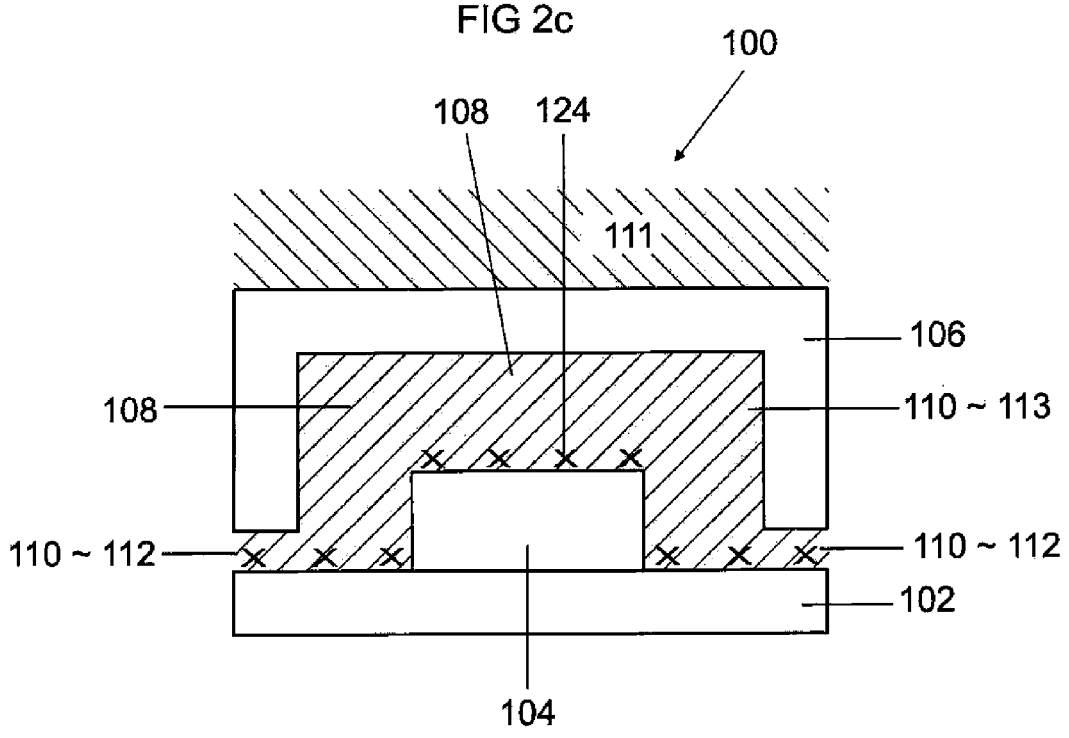

FIG. 2d shows a further example of an optoelectronic component 100 comprising a light-transmissive cover 106 in the form of a cavity 108 in sectional view. The phosphor particles 124 are sedimented on that area of the semiconductor chip 104 which faces away from the substrate 102. As a result, the heat that arises in the phosphor particles 124 can be dissipated particularly well to the semiconductor chip 104. As already in FIG. 2c, the thickness of the cavity seal 112 is limited by the size of the phosphor particles 124.

Figure 2E:
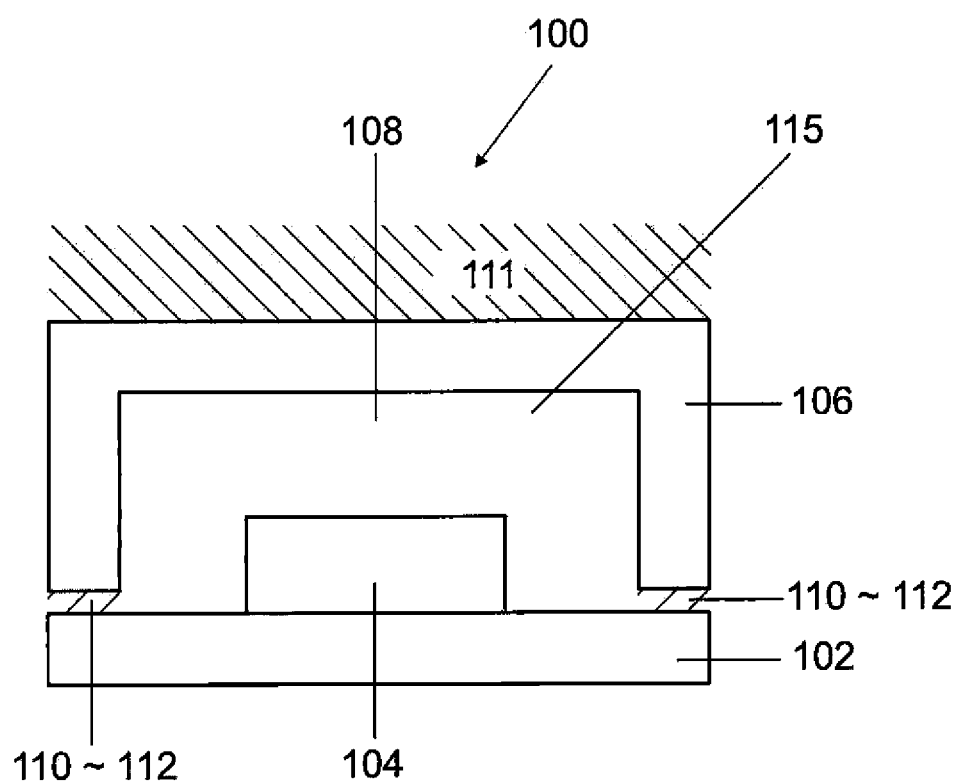

FIG. 2e shows a further example of an optoelectronic component 100 comprising a light-transmissive cover 106 in the form of a cavity 108 in sectional view. The cavity is filled with a gas 115, in particular an inert gas. The cavity seal 112 composed of silicone seals the cavity 108 in a gas-tight manner.

Figure 2F:
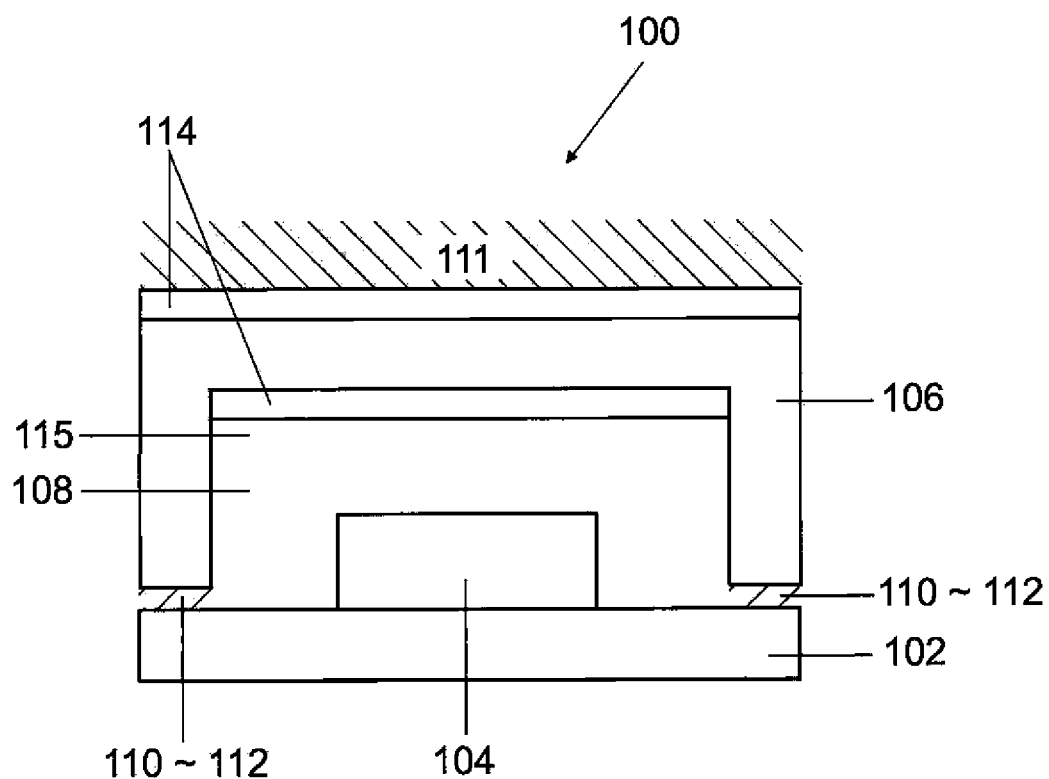

FIG. 2f shows a further example of an optoelectronic component 100 comprising a light-transmissive cover 106 in the form of a cavity 108 in sectional view. In addition to the example in FIG. 2e, in FIG. 2f antireflection layers 114 are applied on both sides of the light-transmissive cover 106. Coating on both sides is advantageous since this increases the coupling-out efficiency relative to a coating only on one side. Electromagnetic radiation emitted by the semiconductor chip 104 passes through the gas 115, the inner antireflection layer 114, the light-transmissive cover 106 and the outer antireflection layer 114. The electromagnetic radiation subsequently emerges into the ambient air 111.

Figure 2G:
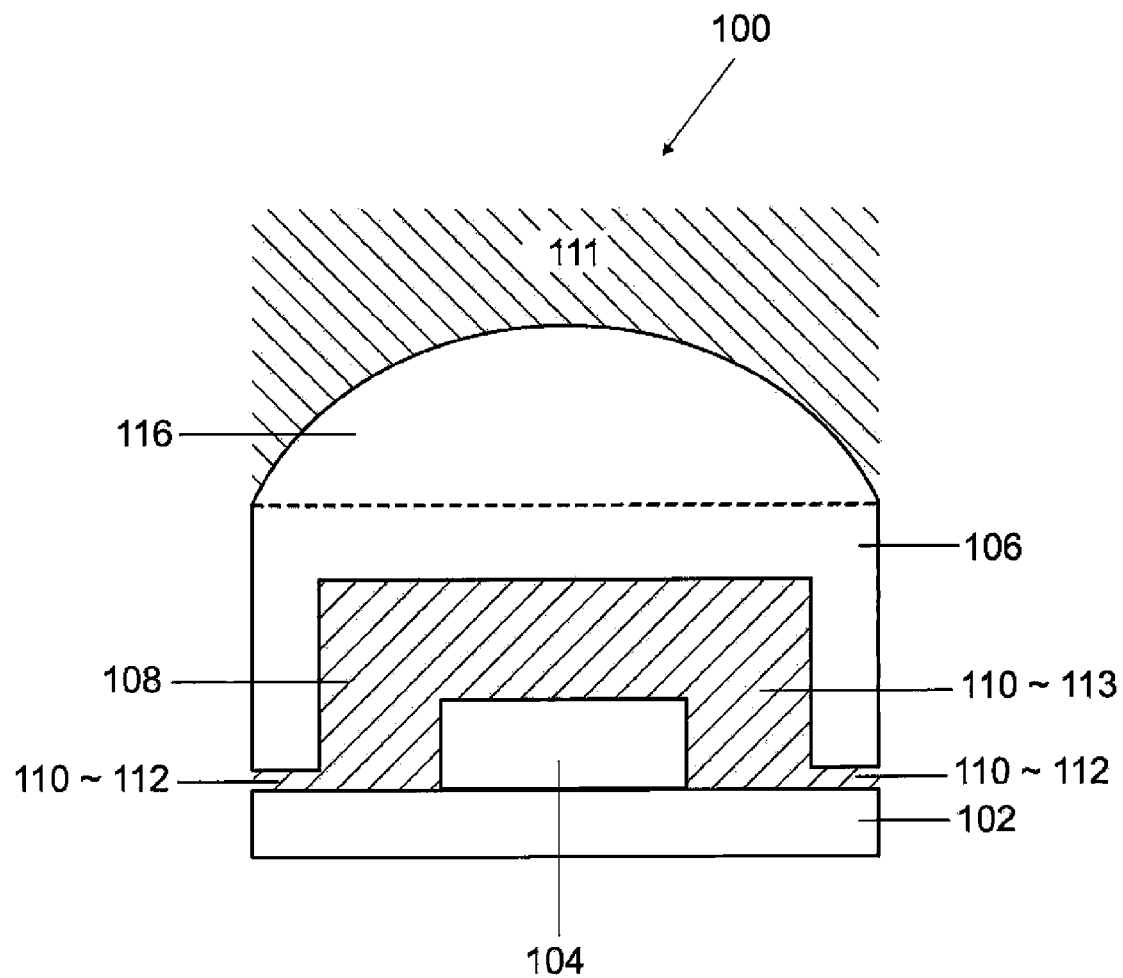

FIG. 2g shows a further example of an optoelectronic component 100 comprising a light-transmissive cover 106 in the form of a cavity 108 in sectional view. The cavity 108 is filled with the connecting material 110 silicone as potting material 113. The connecting material 110 also serves as adhesive 112 between light-transmissive cover 106 and substrate 102. The cavity seal 112 is formed in this case. Part of the light-transmissive cover 106 is a planoconvex lens 116 curved outward. The light beam is refracted upon the transition of the electromagnetic radiation from the curved surface of the glass lens 116 to the ambient air 111. The beam path can be influenced as desired by the choice of the radius of curvature of the lens 116.

Figure 2H:
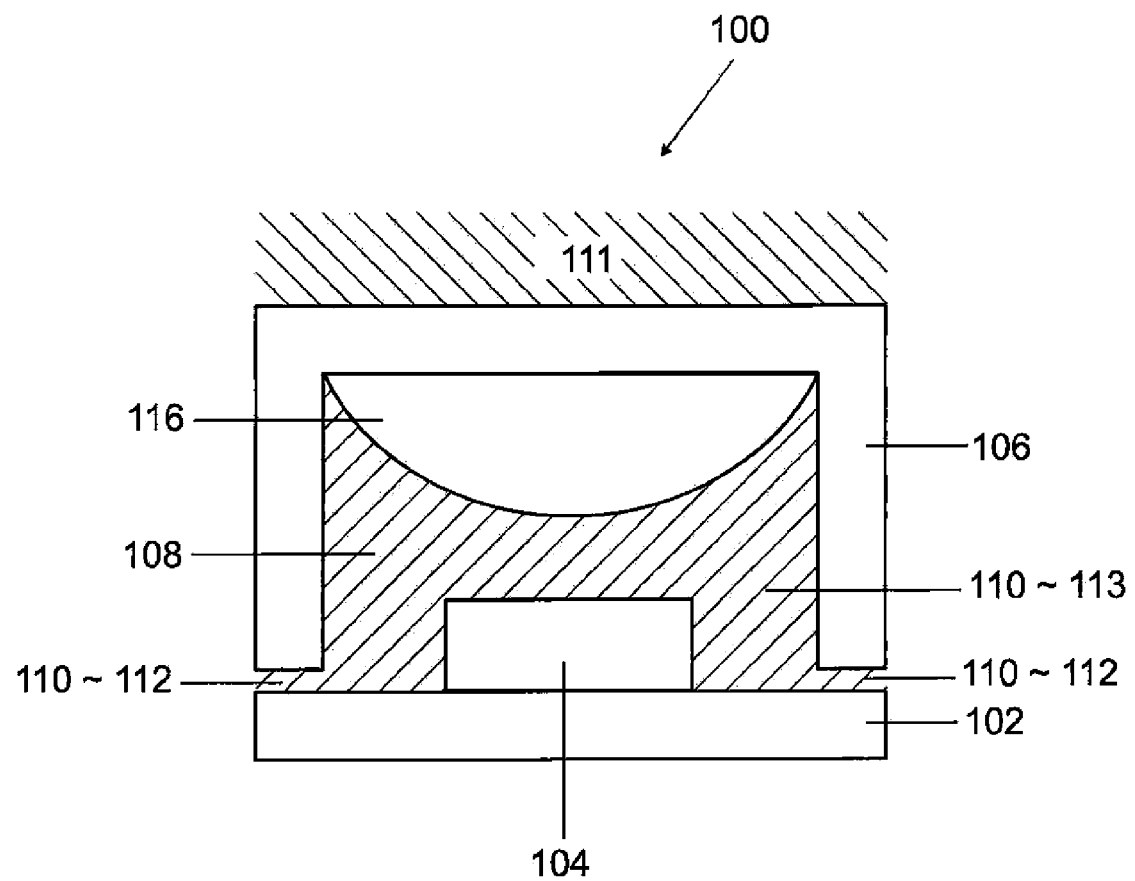

FIG. 2h shows a further example of an optoelectronic component 100 comprising a light-transmissive cover 106 in the form of a cavity 108 in sectional view. The lens 116 extends into the cavity 108. The curved surface of the planoconvex lens 116 separates connecting material 110 silicone from the lens material glass. Owing to the similarity of the refractive indexes of silicone and glass, the beam path is hardly influenced upon refraction. The component 100 advantageously terminates toward the outside with a planar surface. This facilitates gripping during the placement process, e.g., by a vacuum pipette.

Figure 2I:
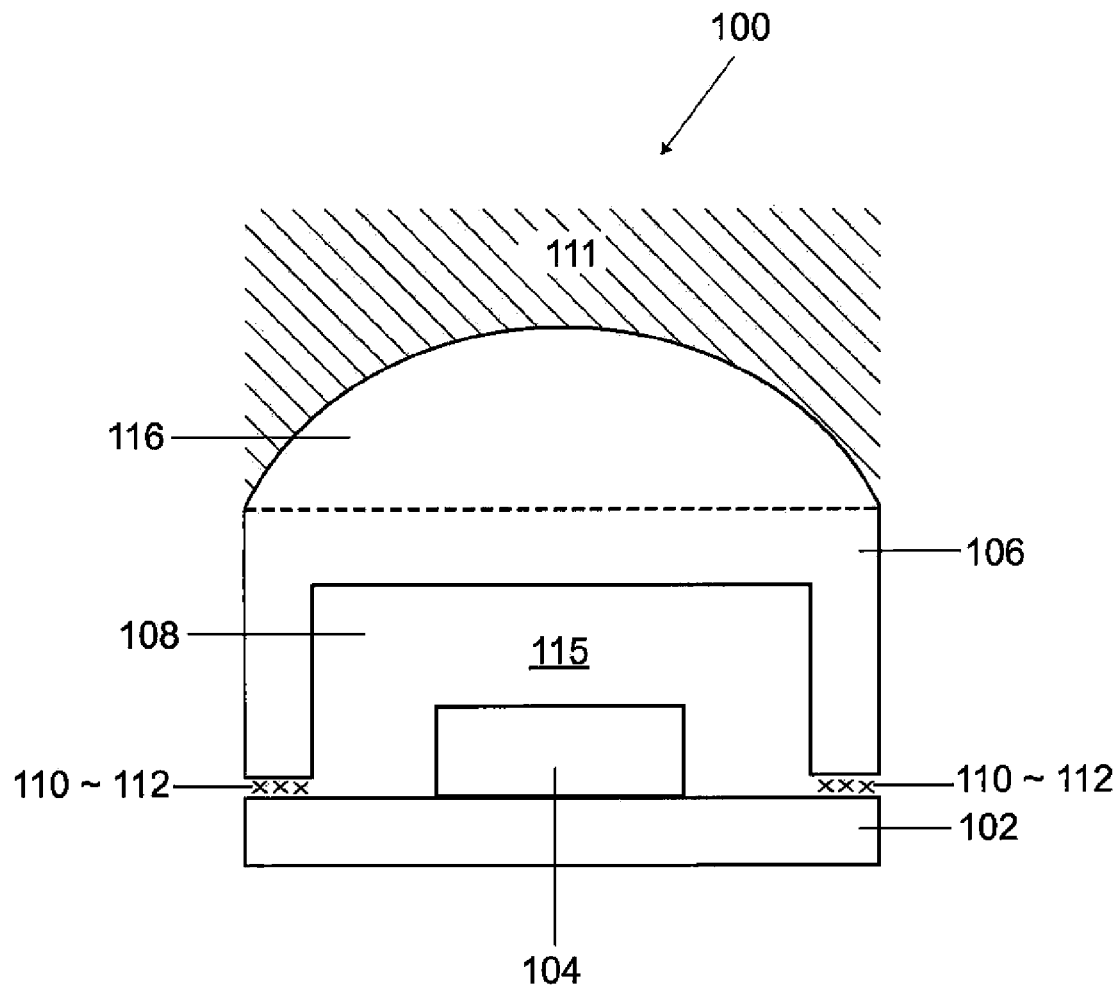

FIG. 2i shows a further example of an optoelectronic component 100 comprising a light-transmissive cover 106 in the form of a cavity 108 in sectional view. The planoconvex lens 116 is curved outwardly. The cavity is filled with an inert gas 115 and sealed in a gas-tight manner outwardly toward the ambient air 111 by the cavity seals 112. Upon the transition of the electromagnetic radiation from the surface of the curved glass lens 116 to the ambient air 111, the light is refracted and the beam path is changed.

Figure 2J:
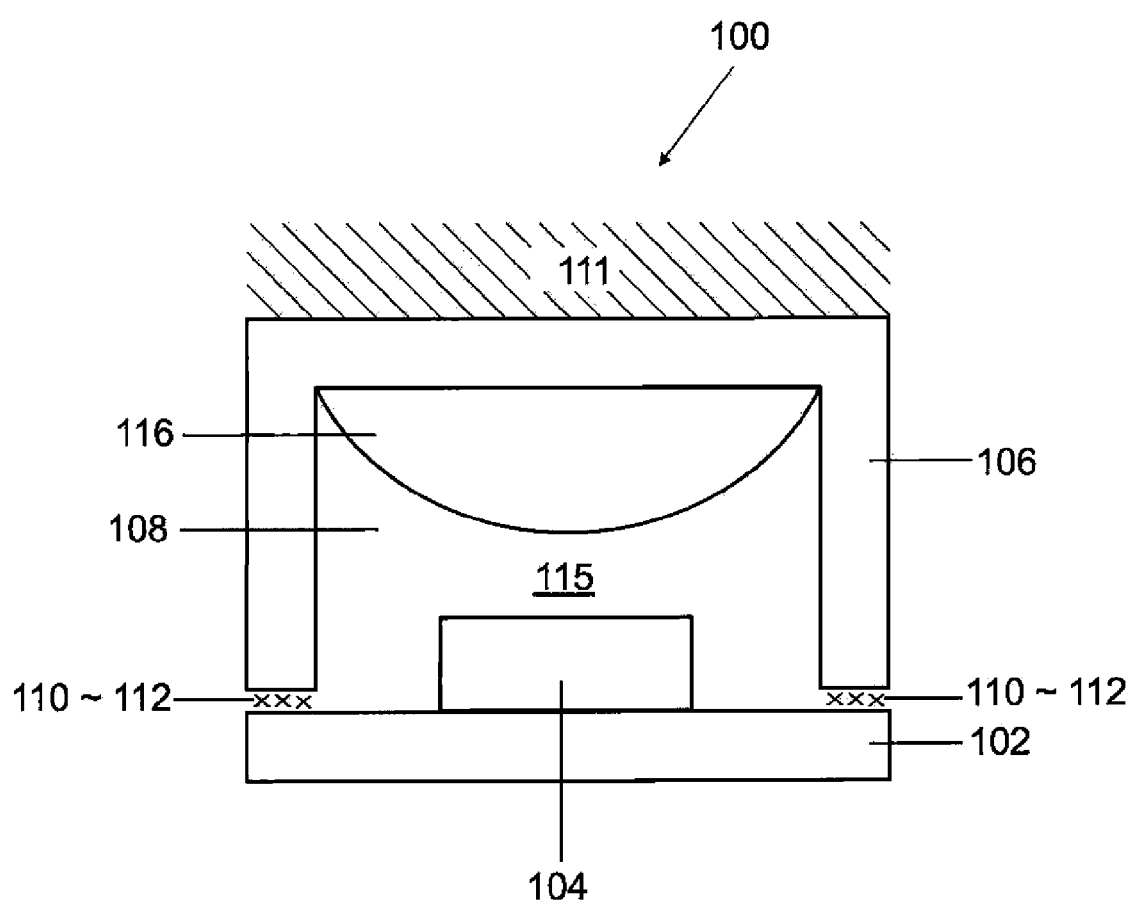

FIG. 2j shows a further example of an optoelectronic component 100 comprising a light-transmissive cover 106 in the form of a cavity 108 in sectional view. The lens 116 is curved inwardly to the cavity 108. Otherwise, the arrangement corresponds to that from FIG. 2i. It is particularly advantageous that the electromagnetic radiation is refracted at the curved surface of the lens 116 upon the transition from the gas (refractive index 1) 115 in the cavity into the lens 116 composed of glass (refractive index 1.5) and, at the same time, the optoelectronic component 100 is sealed toward the outside by a planar surface. With the arrangement from FIG. 2j, therefore, it is possible both to set the beam path and to achieve simple handling during placement.

Figure 3:
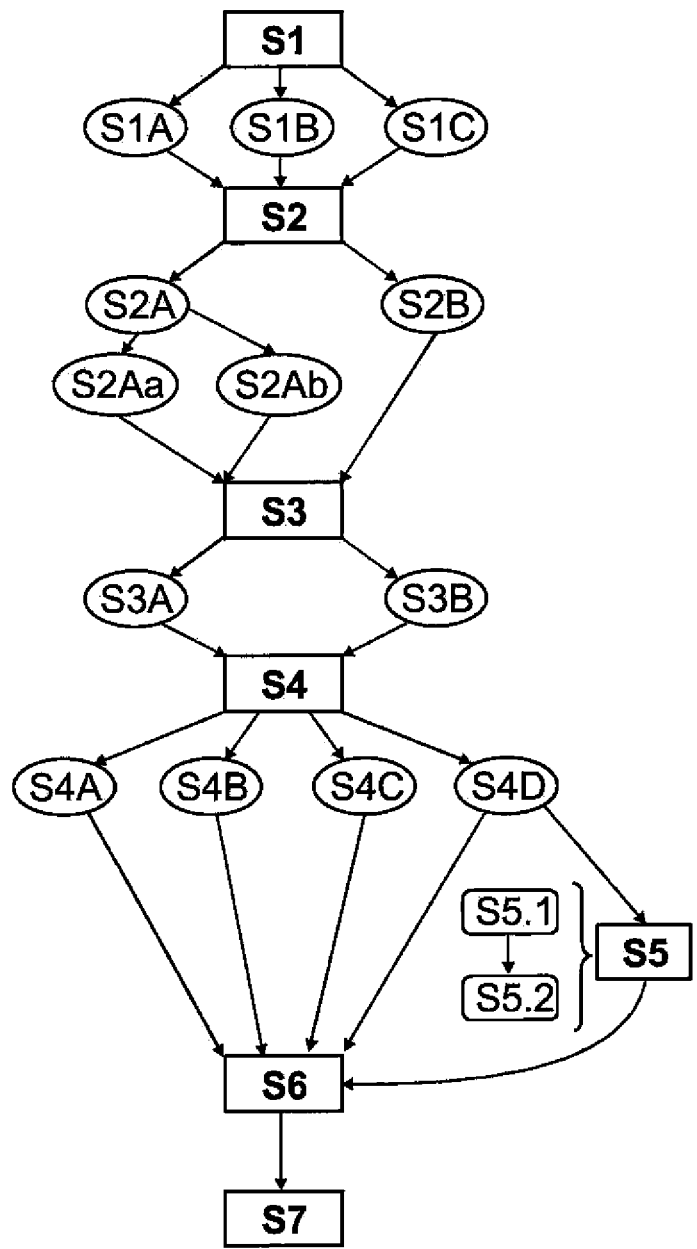
FIG. 3 shows a flowchart for simultaneously producing a plurality of optoelectronic components.

FIG. 3 shows a flowchart for simultaneously producing a plurality of optoelectronic components.

In step S1, a light-transmissive cover 106 is provided. There are a plurality of variants of the light-transmissive cover 106, which can also be combined among one another.

Figure 4B:
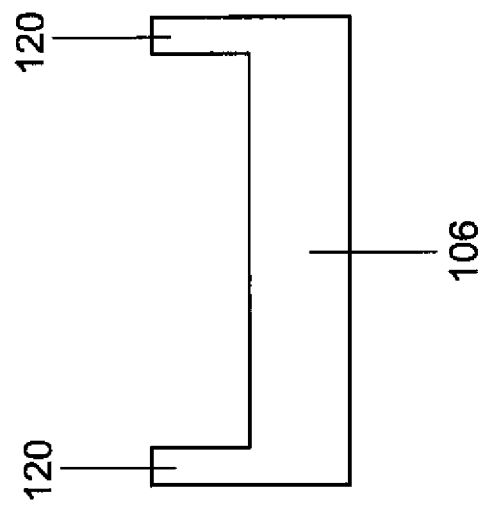
Figure 4A:
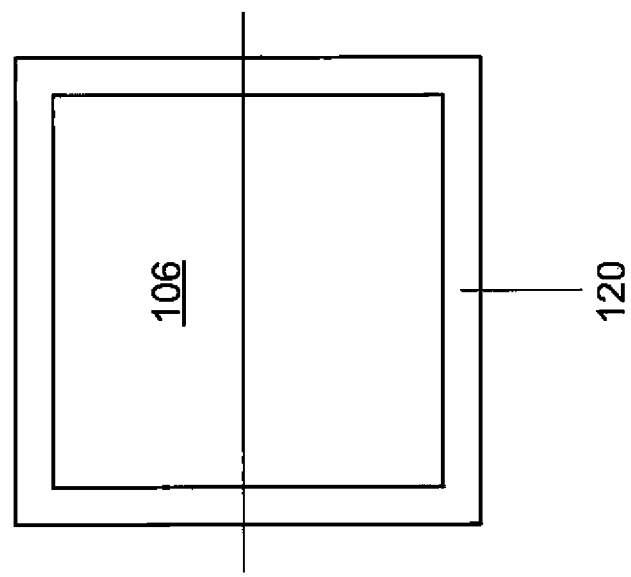

In the variant S1A, a planar light-transmissive cover 106 is provided, in which a circumferential potting seal 120 is provided at its outer edge. FIG. 4a shows a plan view of this light-transmissive cover 106. FIG. 4b shows a sectional view through this light-transmissive cover 106. The circumferential potting seal 120 comprises an adhesive film composed of soft silicone.

Figure 5A:
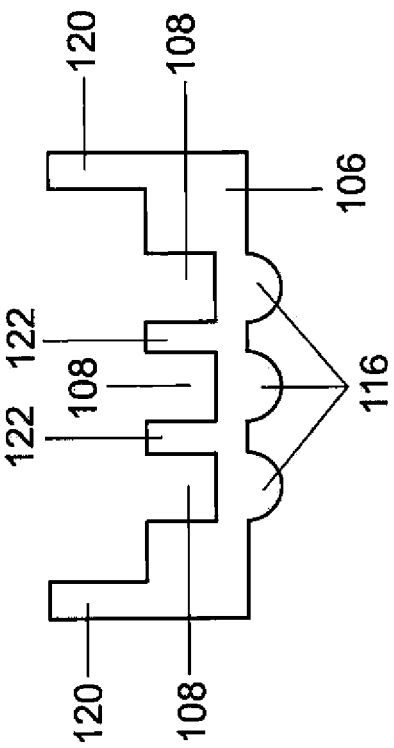
Figure 5B:
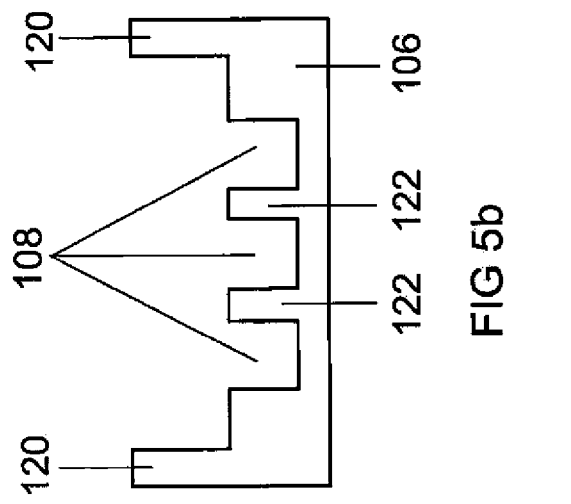
Figure 5C:
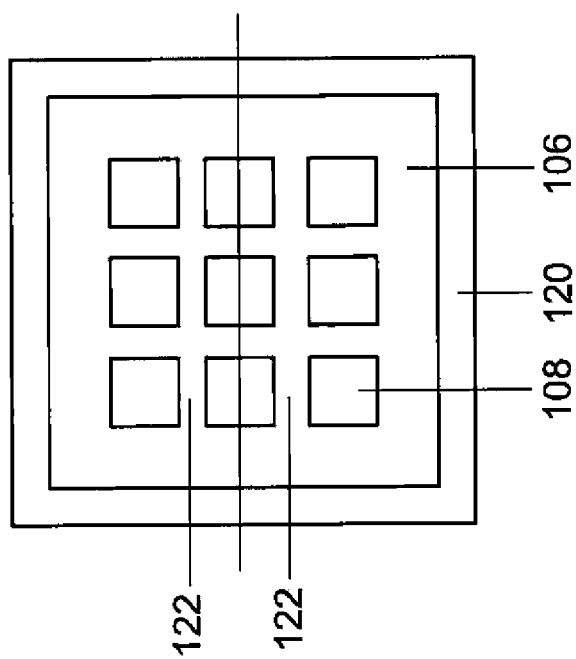

In the variant S1B, a light-transmissive cover 106 having cavities 108 and a circumferential potting seal 120 is provided. FIG. 5a shows a plan view of this light-transmissive cover 106. Webs 122 are arranged between the cavities 108. The cavities 108 can be produced by an etching step at an originally planar light-transmissive cover 106 having a homogeneous thickness. FIGS. 5b and 5c show sectional views through this light-transmissive cover 106. FIG. 5b shows a light-transmissive cover 106 wherein cavities 108 are introduced into the glass cover 106 on one side and the other side is planar. FIG. 5b shows a light-transmissive cover 106 wherein cavities 108 are introduced into the glass cover 106 on one side and lenses 116 are formed above the cavities 108 on the other side. The lenses 116 can also be produced by an etching step from an originally planar light-transmissive cover 106 having a homogeneous thickness.

In the variant S1C, a light-transmissive cover 106 having cavities 108 is provided. Webs 122 are arranged between the cavities 108. No potting seal 120 is provided. FIG. 6a shows a plan view of this light-transmissive cover 106. FIG. 6b shows a sectional view through this light-transmissive cover 106.

In step S2, a connecting material 110 is applied to the light-transmissive cover 106. There are a plurality of variants of applying the connecting material 110 to the light-transmissive cover 106, which can also be combined among one another.

Figure 7A:
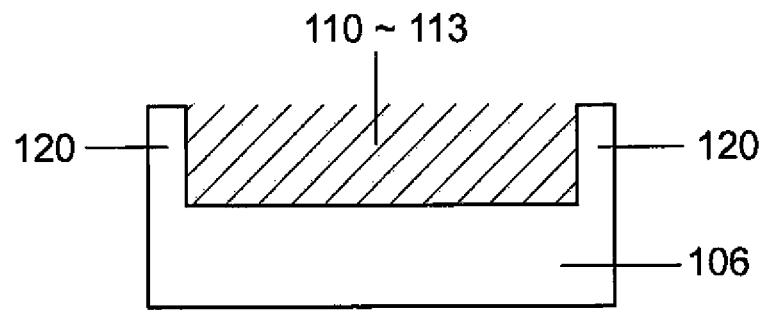
FIGS. 7a, 7b, 8 show examples of light-transmissive covers with applied connecting material in sectional view.
Figure 7B:
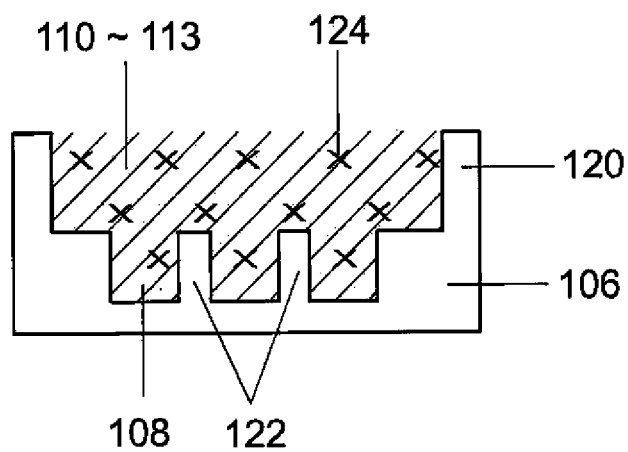

In the variant S2A, the light-transmissive cover 106 is filled with connecting material 110 as potting material 113. The potting seal 120 prevents the potting material 110 silicone from escaping beyond the edge of the light-transmissive cover 106. In the sub-variant 7a, clear silicone is used as connecting material 110. FIG. 7a shows a sectional view of the light-transmissive cover 106 filled with clear silicone and having no cavities 108. In the sub-variant 7b, the potting material 113 silicone filled with phosphor particles 124 is used as connecting material 110. FIG. 7b shows a sectional view of the light-transmissive cover 106 filled with silicone and having cavities 108. Phosphor particles 124 are distributed in the silicone.

Figure 8:
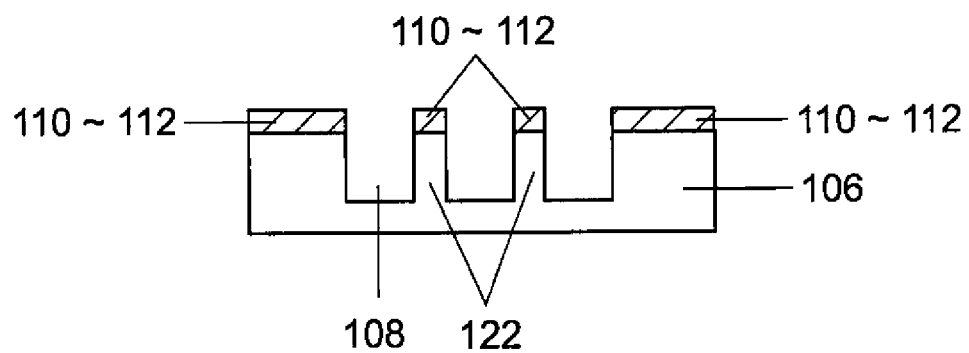

In the variant S2B, the connecting material 110 as cavity seal 112 in the form of an adhesive is applied to the webs 122 between the cavities 108. Moreover, adhesive 112 is also applied at the edges of the light-transmissive cover 106. Silicones, epoxy or hybrids is/are suitable as adhesive 112. Silicone-epoxy or silicone-polyester can be used as hybrids. The adhesive 112 need not be radiation-stable, for which reason the use of inexpensive epoxy is sufficient. The adhesive 112 can be applied by blade coating. FIG. 8 shows a sectional view of the light-transmissive cover 106 provided with adhesive 112.

In step S3, a substrate 102 is provided, on which a plurality of semiconductor chips 104 are arranged. There are a plurality of variants for providing the substrate 102 with the plurality of semiconductor chips 104.

In the variant S3A, a substrate 102 is provided, on which the plurality of semiconductor chips 104 are arranged regularly. FIG. 9a shows a plan view of the substrate 102 with the semiconductor chips 104. FIG. 9b shows a sectional view of the substrate 102 with the semiconductor chips 104.

In the variant S3B, a substrate 102 is provided, on which the plurality of semiconductor chips 104 are arranged regularly. In contrast to the variant S3A, a conversion layer 118 is applied directly on that area of the semiconductor chips 104 which faces away from the substrate 102. FIG. 10a shows a plan view of the substrate 102 with the semiconductor chips 104 which are in each case covered by the conversion layer 118. FIG. 10b shows a sectional view of the substrate 102 with the semiconductor chips 104 which are in each case covered by the conversion layer 118. The conversion layer 118 can be applied to the semiconductor chips 104 in the form of a converter-filled lamina or by screen printing.

In step S4, the substrate 102 with the plurality of semiconductor chips 104 is connected to the light-transmissive cover 106. In this case, the semiconductor chips 104 face toward the light-transmissive cover 106. There are a plurality of variants for connecting substrate 102 to light-transmissive cover 106.

Figure 11:
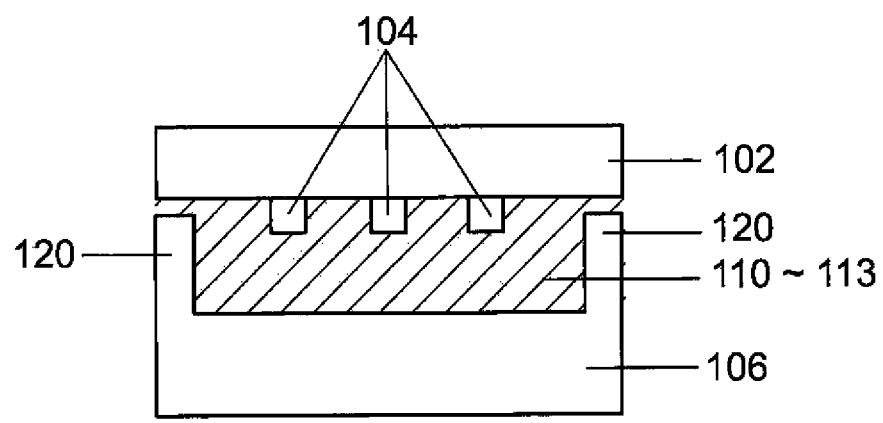
FIGS. 11, 12, 13, 14 show examples of the unit including substrate with a plurality of semiconductor chips and light-transmissive cover in sectional view.

In the variant S4A, the substrate 102 with the semiconductor chips 104 is placed onto the light-transmissive cover 106. The area of the light-transmissive cover 106 which faces toward the substrate 102 is planar, that is to say in particular has no cavities 108. This is advantageous since the alignment of the substrate 102 with the semiconductor chips 104 arranged thereon is obviated. The light-transmissive cover 106 is filled with a potting 113 composed of clear silicone as connecting material 110. A potting seal 120 prevents the silicone from escaping laterally. The potting seal 120 additionally serves as a spacer, whereby it is ensured that the light-transmissive cover 106 is arranged parallel to the substrate 102. FIG. 11 shows a sectional view of the unit comprising substrate 102 with the semiconductor chips 104 and the light-transmissive cover 106. The semiconductor chips 104 are dipped into the liquid connecting material 110 as potting material 113.

Figure 12:
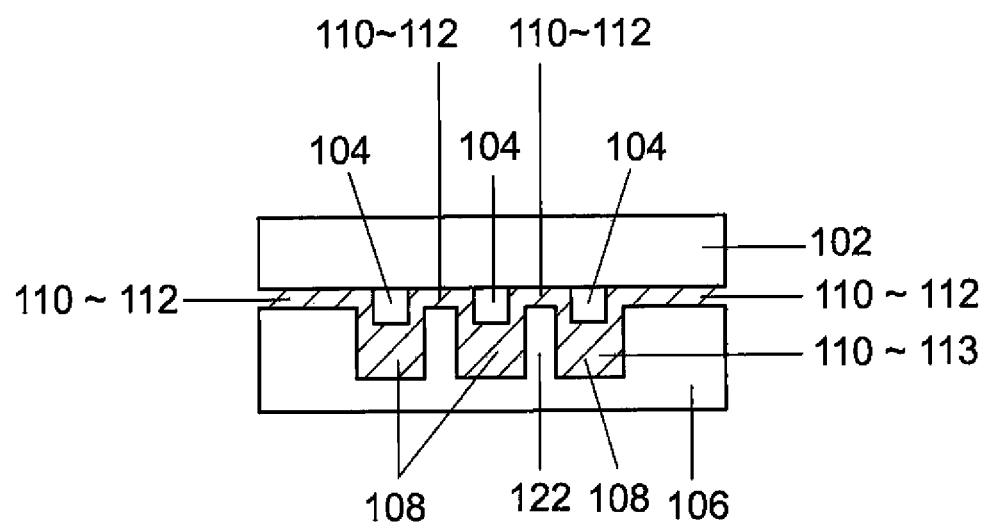

In the variant S4B, a substrate 102 with the plurality of regularly arranged semiconductor chips 104 is placed onto a light-transmissive cover 106 having a plurality of regularly arranged cavities 108. The cavities are filled with clear silicone as potting material 113. Substrate 102 and light-transmissive cover 106 have to be aligned with respect to one another such that the semiconductor chips 104 project into the cavities 108 without touching the sidewalls of the cavities 108. In the case of a light-transmissive cover 106 having cavities 108, the potting seal 120 from variant S4A can be dispensed with. FIG. 12 shows a sectional view of the unit comprising substrate 102 with the semiconductor chips 104 and the light-transmissive cover 106. The cavities 108 are separated from one another by webs 122. The webs 122 also serve as spacers between substrate 102 and light-transmissive cover 106. The liquid connecting material 110 serves as potting material 113 and also as cavity seal 112.

Figure 13:
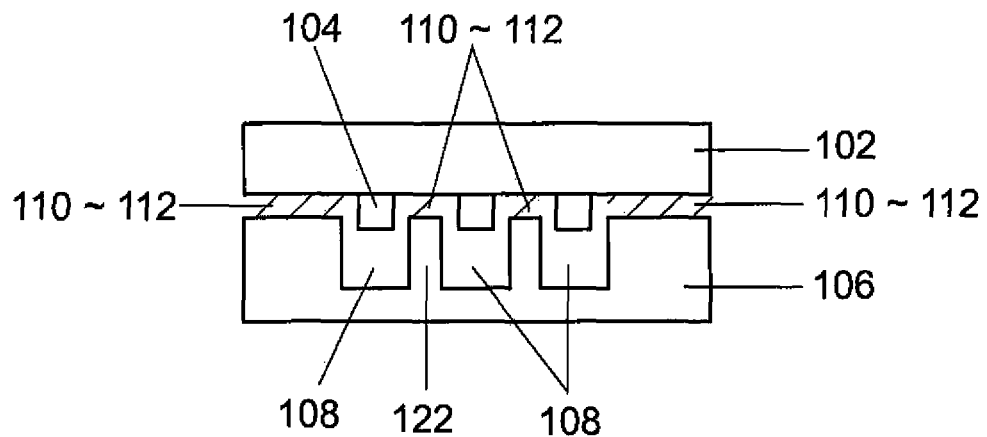

In the variant S4C, a substrate 102 with the plurality of regularly arranged semi-conductor chips 104 is placed onto a light-transmissive cover 106 having a plurality of regularly arranged cavities 108. The connecting material 110 silicone or epoxy is applied as adhesive 112 only to the webs 122 and the circumferential edge of the light-transmissive cover 106. The cavities 108 remain free of connecting material 110. Cavity seals 112 are formed which seal the cavities 108 in a gas-tight manner. The connection of substrate 102 and light-transmissive cover 106 can be effected under a vacuum or in a protective gas atmosphere. FIG. 13 shows a sectional view of the unit comprising substrate 102 with the semiconductor chips 104 and the light-transmissive cover 106. The cavities 108 are separated from one another by webs 122.

Figure 14:
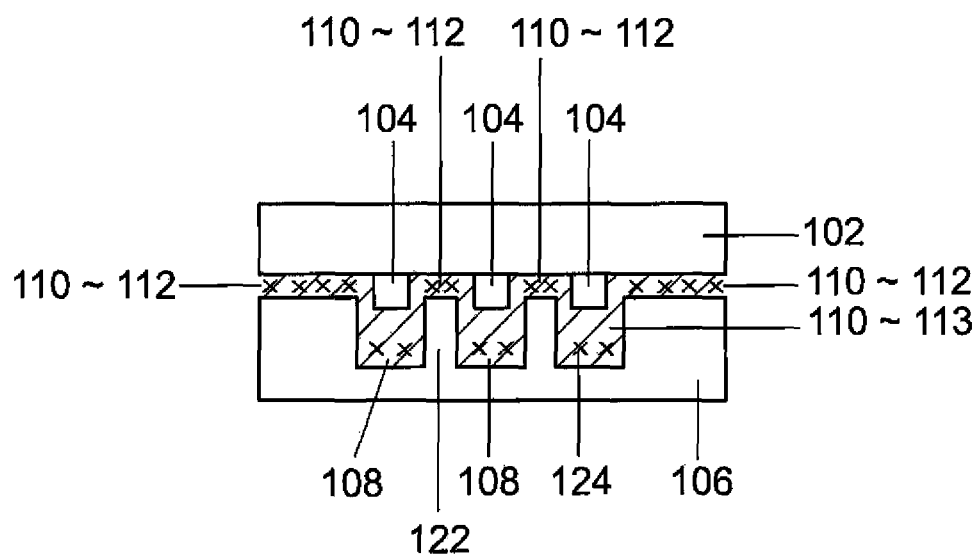

In the variant S4D, a substrate 102 with the plurality of regularly arranged semiconductor chips 104 is placed onto a light-transmissive cover 106 having a plurality of regularly arranged cavities 108. The cavities 108 are filled with a connecting material 110 as potting material 113. The connecting material 110 comprises silicone filled with phosphor particles 124. The phosphor particles 124 can be distributed homogeneously in the silicone. FIG. 14 shows a sectional view of the unit comprising substrate 102 with the semiconductor chips 104 and the light-transmissive cover 106. The cavities 108 are separated from one another by webs 122. The cavities 108 are filled with silicone into which phosphor particles 124 are introduced. Moreover, cavity seals 112 are formed.

Figure 15:
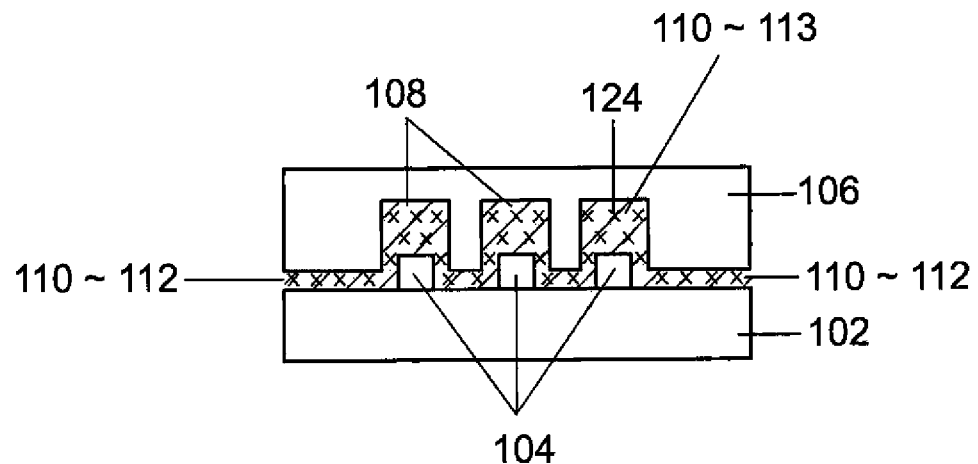
FIGS. 15, 16 show examples of a unit including substrate with a plurality of semiconductor-chips and light-transmissive cover in a rotated position in sectional view.

Method step S4D can optionally be followed by a method step S5. In step S5, a layer of phosphor particles 124 is sedimented onto those areas of the semiconductor chips 104 facing away from the substrate 102. Method step S5 is subdivided into two sub-steps S5.1 and S5.2, which directly succeed one another. In sub-step S5.1, directly after connection of substrate 102 and light-transmissive cover 106, the unit comprising substrate 102 and light-transmissive cover 106 is rotated by 180° about an axis lying in the plane formed between the light-transmissive cover 106 and the substrate 102. FIG. 15 shows a sectional view of the unit comprising substrate 102 with the semiconductor chips 104 and the light-transmissive cover 106. The cavities 108 are completely filled with silicone as potting material 113 in which phosphor particles 124 are distributed homogeneously. In sub-step S5.2, the phosphor particles 124 are sedimented. This can be effected by the influence of gravitational force and/or a centrifugal force on the phosphor particles 124 in the liquid connecting material 110 silicone.

Figure 16:
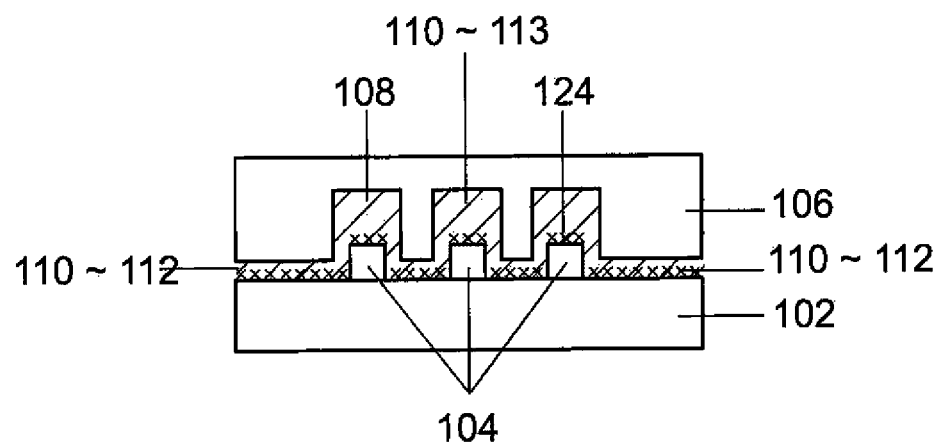

FIG. 16 shows a sectional view of the unit comprising substrate 102 with the semiconductor chips 104 and the light-transmissive cover 106. The cavities 108 are completely filled with clear silicone as potting material 113. A sedimented layer of phosphor particles 124 is arranged in direct contact with that area of the semiconductor chips 104 facing away from the substrate 102. Flush termination of the sedimented conversion layer with the semiconductor chip makes it possible to prevent the undesirable lateral emission of primary light, in particular blue light, from the optoelectronic component.

Step S4 or respectively step S5 is followed by a step S6. In step S6, the liquid connecting material 110 is cured. The curing takes place at approximately 150° C. for a duration of approximately 1 h in the case of silicone as connecting material 110. What is achieved by the curing is that substrate 102 and semiconductor chip 106 are fixedly connected to one another.

In an optional step S7, the optoelectronic components 100 are singulated. The singulation can be effected by separating by grinding, laser separation, water jet cutting or scribing and breaking. In the case of light-transmissive covers 106 having cavities 108, the cured unit comprising substrate 102 and light-transmissive cover 106 is sawed apart centrally through the webs 122. This gives rise to optoelectronic components 100 having a cavity 108 whose side walls are perpendicular to the substrate 102. Examples of the optoelectronic components 100 produced in this case are illustrated in FIGS. 2a to 2j.

In the case of light-transmissive covers 106 without cavities 108, less stringent requirements are made of the accuracy of singulation. It is merely necessary to ensure that the semiconductor chips 104 are not damaged during singulation. Examples of the optoelectronic components 100 produced in this case are illustrated in FIGS. 1a to 1d.

The invention claimed is:

1. An optoelectronic component comprising:
   a substrate,
   a semiconductor chip arranged on the substrate, and
   a light-transmissive cover,
   wherein the light-transmissive cover covers at least an area of the semiconductor chip facing away from the substrate,
   the light-transmissive cover has a hardness greater than that of silicone, and
   a connecting material is arranged as a potting material in a cavity between the light-transmissive cover and the substrate such that those areas of the semiconductor chip not covered by the substrate are surrounded by the connecting material, wherein the connecting material forms a cavity seal between the substrate and the cover at the same time.

2. The optoelectronic component according to claim 1, wherein a cavity is formed in the light-transmissive cover.

3. The optoelectronic component according to claim 2, wherein the semiconductor chip extends at least partly into the cavity.

4. The optoelectronic component according to claim 2, wherein the cavity is filled with a gas.

5. The optoelectronic component according to claim 2, wherein the cavity is fixed with a connecting material as an adhesive in the form of a cavity seal on the substrate.

6. The optoelectronic component according to claim 1, wherein the connecting material comprises silicone.

7. The optoelectronic component according to claim 1, wherein the light-transmissive cover is a glass cover.

8. The optoelectronic component according to claim 1, wherein the light-transmissive cover has an antireflection layer.

9. The optoelectronic component according to claim 1, wherein the light-transmissive cover has a thickness of approximately 30 μm to approximately 100 μm.

10. The optoelectronic component according to claim 1, wherein an imaging element, in particular a lens, is arranged on an area of the light-transmissive cover facing away from the substrate.

11. The optoelectronic component according to claim 1, wherein a conversion layer is applied directly to the area of the semiconductor chip facing away from the substrate.

12. A method of producing an optoelectronic component comprising:
    providing a light-transmissive cover;
    applying connecting material filled with phosphor particles to the light-transmissive cover;
    providing a substrate on which a plurality of semiconductor chips are arranged;
    connecting the substrate with the plurality of semiconductor chips to the light-transmissive cover, wherein the semiconductor chips face in a direction of the light-transmissive cover rotating the unit comprising substrate and light-transmissive cover by 180° about an axis lying in a plane formed between the light-transmissive cover and the substrate after connecting the substrate to the light-transmissive cover and before curing the connecting material filled with phosphor particles such that the phosphor particles are sedimented; and
    curing the connecting material.

13. The method according to claim 12, wherein the light-transmissive cover has a circumferential potting seal at its outer edge.

14. The method according to claim 12, wherein the light-transmissive cover has a plurality of cavities with webs situated therebetween.

15. The method according to claim 14, wherein applying connecting material to the light-transmissive cover comprises applying connecting material as an adhesive to webs between the cavities.

16. The method according to claim 12, wherein applying connecting material to the light-transmissive cover comprises filling the light-transmissive cover with connecting material as a potting material.

17. The method according to claim 12, wherein, when providing the substrate with a plurality of semiconductor chips, a conversion layer is already applied directly to the area of the semiconductor chips facing away from the substrate.

18. The optoelectronic component of claim 1, wherein side faces of the optoelectronic component are formed at least partially by the connecting material.

* * * * *